United States Patent [19]

Baldi

[11] Patent Number: 4,464,430
[45] Date of Patent: Aug. 7, 1984

[54] METAL DIFFUSION

[75] Inventor: Alfonso L. Baldi, Wynnewood, Pa.

[73] Assignee: Alloy Surfaces Company, Inc., Wilmington, Del.

[21] Appl. No.: 242,350

[22] Filed: Mar. 10, 1981

Related U.S. Application Data

[63] Continuation-in-part of Ser. No. 238,500, Feb. 26, 1981, Pat. No. 4,350,719, Ser. No. 71,741, Aug. 30, 1979, Ser. No. 963,313, Nov. 27, 1978, abandoned, Ser. No. 851,504, Nov. 14, 1977, and Ser. No. 809,189, Jun. 23, 1977, Pat. No. 4,308,160, said Ser. No. 809,189, Ser. No. 851,504, Ser. No. 963,313, and Ser. No. 71,741, each is a continuation-in-part of Ser. No. 752,855, Dec. 21, 1976, Pat. No. 4,208,453, Ser. No. 963,313, continuation-in-part of Ser. No. 614,834, Sep. 19, 1975, Pat. No. 4,141,760, Ser. No. 851,504, and Ser. No. 809,189, each is a continuation-in-part of Ser. No. 694,951, Jun. 11, 1976, abandoned, and Ser. No. 614,834, said Ser. No. 614,834, is a continuation-in-part of Ser. No. 466,908, May 3, 1974, Pat. No. 3,958,047, which is a continuation-in-part of Ser. No. 328,378, Jan. 31, 1973, Pat. No. 3,867,184.

[51] Int. Cl.$^3$ .............................................. B05D 3/00
[52] U.S. Cl. .................................. 428/201; 427/252; 427/253; 427/383.9; 427/259; 427/300; 428/208; 428/209
[58] Field of Search ............... 427/252, 253, 259, 300, 427/383.9; 428/208, 209, 201

[56] References Cited

U.S. PATENT DOCUMENTS

| | | | |
|---|---|---|---|
| 3,764,371 | 10/1973 | Baldi | 148/6.16 |
| 3,785,854 | 1/1974 | Baldi | 427/282 |
| 3,801,357 | 4/1974 | Baldi | 427/282 |

Primary Examiner—Sam Silverberg
Attorney, Agent, or Firm—Connolly & Hutz

[57] ABSTRACT

Very good masking of pack diffusion aluminizing on any metal to keep portions from being diffusion coated, is effected by localized coating the lowest layer of which is depletion-reducing masking powder that can have same composition as substrates, mixed with non-contaminating film-former such as acrylic resin. The upper coating layer can be of non-contaminating particles like nickel of $Cr_2O_3$ that upon aluminizing or chromizing become coherently held together to form a secure sheath. Such sheath can also be used for holding localized diffusion-coating layer in place. Film-former can be dissolved in volatile solvent, preferably methyl chloroform, in which masking powder or sheath-forming powder is suspended. Chromizing can be performed before aluminizing for greater effects. Aluminized cases are stripped from superalloys by alternating dips in fluoride-containing and fluoride-free aqueous nitric acid.

10 Claims, No Drawings

METAL DIFFUSION

This application is a continuation-in-part of Ser. No. 238,500 filed Feb. 26, 1981 (U.S. Pat. No. 4,350,719 granted Sept. 21, 1982), Ser. No. 71,741 filed Aug. 30, 1979, subsequently abandoned, Ser. No. 963,313 filed Nov. 27, 1978 (subsequently abandoned), Ser. No. 851,504 filed Nov. 14, 1977, and Ser. No. 809,189 filed June 23, 1977 (U.S. Pat. No. 4,308,160 granted Dec. 29, 1981), the earliest four of which are in turn continuation-in-part of Ser. No. 752,855 filed Dec. 21, 1976 (U.S. Pat. No. 4,208,453 granted June 17, 1980). Ser. No. 963,313 is also a continuation-in-part of Ser. No. 614,834 filed Sept. 19, 1975 (U.S. Pat. No. 4,141,760 granted Feb. 27, 1979), while Ser. Nos. 851,504 and 809,189 are each also continuations-in-part of Ser. No. 694,951 filed June 11, 1976 (subsequently abandoned) and Ser. No. 614,834. Ser. No. 614,834 is furthermore a continuation-in-part of Ser. No. 466,908 filed May 3, 1974 (U.S. Pat. No. 3,958,047 granted May 18, 1976) which in its turn is a continuation-in-part of Ser. No. 328,378 filed Jan. 31, 1973 (U.S. Pat. No. 3,867,184 granted Feb. 18, 1975).

The present invention relates to the coating of metals to increase their resistance to corrosion and other chemical attacks.

Among the objects of the present invention is the provision of novel coating techniques and compositions for use therewith, as well as novel coated products, all suitable for commercial operations.

Additional objects of the present invention include compositions and techniques for confining protective diffusion coatings to desired locations on workpieces such as jet engine components to be protected by the coatings.

The foregoing as well as further objects of the present invention will be more fully understood from the following description of several of its exemplifications.

As pointed out in the earlier applications, diffusion aluminizing of ferrous metals greatly improves their corrosion resistance, particularly when top coatings are applied over the diffusion coating, and particularly for those ferrous surfaces containing at least 1% chromium. In some cases suchh diffusion aluminizing is best masked off from undesired portions of the surface of the workpiece being coated. Thus where the dimensional accuracy of a workpiece is a high order, such as on the root of a rotor blade that is to be securely received in a socket, it is frequently impractical to permit aluminizing of that root because the added aluminum increases the root's dimensions. Such masking problems arise more frequently with the superalloy components in the hot section of a turbine engine, where aluminizing and chromizing is widely practiced. Chromizing also increases dimensions.

A particularly desirable masking technique according to the present invention, involves the coating of the portions to be masked with at least one layer of finely divided essentially inert material such as inert diluent, or inert diluent mixed with a small amount, not over about 15%, of a depletion-reducing masking material such as powdered chromium, and applying over that coating at least one stratum of finely divided non-contaminating solid particles that upon subjection to diffusion coating become coherently held together to form a secure masking sheath. To hold the layers in place beforehand, the foregoing solid particles are preferably suspended in a solution of a binder in a volatile solvent, using as a binder a resin that does not interfere with the diffusion coating or the masking, and is preferably driven off essentially completely by the high temperatures of the diffusion coating.

The sheath-forming layer or one or more of the strata which constitute this layer, preferably have $Cr_2O_3$, nickel or mixtures of these two, as the particles that become coherently united by the aluminizing. Neither of these materials contaminate superalloy or stainless steel workpieces inasmuch as only chromium or nickel can be introduced into the workpieces from these sources, and these two metals are already present in the workpieces. Chromium and nickel are also not considered contaminants for low alloy steels, particularly those ferrous alloys containing at least 1% chromium. Even iron and plain carbon steels are not adversely affected by a little chromium or nickel diffused into their surfaces.

The $Cr_2O_3$ and nickel particles, particularly the latter, are so actively effective to make the foregoing sheaths that they can be diluted with as much as twice their weight of alumina or other inert filler, without losing their sheath-forming ability. While they can be used in undiluted form, it is preferred to dilute these ingredients with some filler, at least about half as much filler as active material, by weight. Such dilution diminishes the amount of material that can consume the diffusing metal, and also reduces the masking cost. Moreover undiluted coatings of $Cr_2O_3$ and resin tend to crack on drying.

For best masking of those aluminizing diffusions that are conducted at extremely high temperatures, e.g. 1900° F. or higher, it is helpful to have a three-layer masking combination in which the workpiece-contacting layer is of the depletion-reducing type, the next layer of the $Cr_2O_3$ type, and the outermost layer of the nickel type. The outermost two layers can be mixed together as a single combination layer, if desired. The presence of $Cr_2O_3$ in the outermost layer imparts a characteristic greenish cast to that layer and this helps to visually distinguish the fully prepared workpieces from those which are only coated with the depletion-reducing or lowermost masking layer.

A feature of the present invention is that the masking materials are conveniently marketed as a kit of chemicals. Such a kit can for instance consist of a container holding a quantity of depletion-reducing masking aluminide mixture of U.S. Pat. No. 3,801,357 for example, another container or two holding sheath-forming mixture or mixtures, a further container holding a solution of the resin in the volatile solvent, and if desired a still further container holding extra solvent. These kits enable very effective masking under all diffusion conditions, even at temperatures as low as 1100° F. or lower. Thus aluminum diffusion into some jet engine compressor parts is conducted at temperatures as low as 900° F., and can be masked in accordance with the present invention.

Turning now to a more detailed description of the present invention, the following is an example.

EXAMPLE 1

A number of hot section first stage jet engine blades made of B-1900 nickel-base superalloy had their roots dipped in the following mixture:
Powdered $Ni_3Al$ having 20 to 100 micron particle size 111 g.

Powdered chromium having 20 to 100 micron particle size 3.4 g.
Powdered alumina having 20 to 100 micron particle size 111 g.
Poly(ethylmethacrylate) 9 g.
Methyl chloroform 123 g.

The resin is first dissolved in the methyl chloroform, and the remaining ingredients then added with stirring to form a uniform suspension that does not settle very rapidly.

A single dip coating treatment with the suspension at room temperature, about 60° to about 80° F., deposits a layer weighing about 130 milligrams per square centimeter after the methyl chloroform solvent is permitted to evaporate. Only a fraction of a minute is needed to complete such a coating, and it is helpful to repeat the dip several times until the combined coatings weigh about 500 grams per square centimeter. Dipping a previously dipped coating in the dispersion does not remove any significant portion of the previous coating, particularly if the previous coating had been permitted to dry at room temperature for at least about ½ minute.

After three or more dips as above, the thus-coated blades are dipped in the following coating mixture:
Powdered nickel, 20 to 100 micron particle size 175 g.
Powdered alumina, 20 to 100 micron particle size 175 g.
Poly(ethylmethacrylate) 4.7 g.
Methyl chloroform 62.1 g.

This dipping is repeated two more times, with intervening dryings at least about ½ minute long each, to build up the lattter coating to about 500 milligrams per square centimeter. The blades were then promptly inserted in a pre-fired diffusion aluminizing pack having the following composition in parts by weight.
Powdered aluminum, 20 to 60 micron particle size 10
Powdered chromium, about 10 micron particle size 40
Powdered alumina, 20 to 60 micron particle size 50
Powdered NH$_4$Cl 0.3
into which additinal NH$_4$Cl was blended to bring its concentration to the 0.3% value and make up for pre-firing volatilization. All of the blades were completely covered by the pack, and the mass was held in a diffusion coating retort. Diffusion coating was then carried out with a 6 hour hold at 1875° F. in the manner described in U.S. Pat. No. 3,785,854. The blades are then removed from the cooled retort and carry a hard shell-like sheath or crust where the roots had been covered with the masking dips. These crusts are quite adherent and coherent, so that the aluminizing pack is not materially contaminated by the masking layers, and can be reused for additional aluminizing without further precautions.

Co$_3$Al or Co$_2$Al or any of the other masking aluminides referred to in U.S. Pat. No. 3,801,357 can be use in place of the Ni$_3$Al in the foregoing example, with somewhat poorer results. Although the cobalt aluminide masking powders give better results with cobalt-based substrates, those results are still not as good as the results obtained from the nickel aluminides.

The crusts are fairly brittle and can be readily removed from the blades by light blows of a hammer or even a wood club, or by blasting with an air-propelled stream of nickel shot. The crust fragments are discarded leaving the blade roots showing no aluminizing, and the balance of the blades with a 3 mil aluminized case.

The shell or crust formation of this example is due to the fact that the nickel powder in tbe outermost masking layer undergoes so much aluminizing that these powder particles grow together. The dilution of the nickel with as much as four-thirds its weight of inert material such as alumina does not prevent such growing together, and neither is it prevented by the presence of the resin in the dipped masking composition. Such resin is completely driven off duringthe initial portion of the diffusion coating heat, but the relatively small amount of such resin would not significantly affect the results even if it were to survive the diffusion heat or were carbonized by that heat.

The diluted Ni$_3$Al in the lower layers of masking does not become aluminized sufficiently to cause shell or crust formation, even though those layers also contain a small amount of chromium that by itself would form a shell. Any metal-containing layer in contact with a workpiece should contain at least 25% inert non-metal such as the alumina, or kaolin, to assure that the metal of the layer does not sinter to the workpiece, and such dilution also keeps the Ni$_3$Al from forming a shell or curst.

On the other hand, other aluminizable powders that are essentially inert to the workpiece but form shells, can be used in place of or in addition to the nickel powder in the shell-forming layers. Cr$_2$O$_3$ is another such shell-forming material, apparently undergoing some conversion to aluminized metallic chromium. Being less expensive than nickel, Cr$_2$O$_3$ is particularly desirable for use where masking expenses are to be minimized. Mixtures of nickel and Cr$_2$O$_3$ can be used with an effectiveness corresponding to that of each individuallyand indeed a small amount, such as 5% or even 25%, of Ni$_3$Al can be mixed with the nickel or the Cr$_2$O$_3$ without detracting significantly from the shell-forming results.

All diluents can be omitted from the shell-forming layers, if desired, but this makes it more important to be sure that at least the minimum effective amount of shell-forming layer is applied. In undiluted condition only about 100 milligrams per square centimeter of nickel or Cr$_2$O$_3$ is needed, and the presence of the resin adds an insignificant amount to the shell-forming layer needed. Layers deposited from undiluted Cr$_2$O$_3$ suspended in a resin solution, tend to crack on drying, whereas there is no such cracking when the Cr$_2$O$_3$ is diluted with at least about ¼ its weight of Al$_2$O$_3$ or other diluent. When inert solid diluent such as alumina, resin or even Ni$_3$Al is used with nickel powder, such diluent is preferably not over about 50% by weight of the nickel in the sheath-forming layer. The resin content is preferably not over about 4% of the weight of the layer.

The resin in the outer layers acts to keep the masking layers from rubbing off onto or into the diffusion coating pack during the packing. Thus a stratum of nickel powder, with or without alumina, can be applied over the Ni$_3$Al-chromium-resin lower masking layers as by rotating the blades coated with those masking layers in a falling stream of powdered nickel so that falling powder particles adhere to the resin-containing lower masking layers. This is however not nearly as simple as the application of the outer maksing layers by dipping, its uniformity is not as good, and some of the falling powder so adhered tends to rub off when the workpieces are handled and then the diffusion coating pack is poured over them.

After the first dip or two to apply resin-containing masking layers, some or all subsequent dips can be affected in resin-free suspensions of the coating materials in a solvent that dissolves the resin in the previously applied layers. Inasmuch as coating suspensions entirely free of resin are more difficult to maintain uniform, a little resin or other viscosity-increasing material can be added to such dispersions to reduce the settling rate of the dispersed powders.

It is also helpful to use a combination of shell-forming masking layers in which some are of the type that depend on the presence of nickel powder, and others are of the type that depend on the presence of $Cr_2O_3$ powder. Thus it is particularly desirable with aluminizings that are effected at about 2000° F. or higher, for the shell-forming combination of layers to have the lowermost shell-forming layer based on $Cr_2O_3$ and built up to at least about 300 milligrams per square centimeter, while the uppermost are based on nickel powder and are also built up to at least about 300 milligrams per square centimeter. It is not desirable for the $Cr_2O_3$ layers to be in contact with the substrate metal.

While other resins and solvents can be used to make the masking alyers of the present invention, the acrylic resins are preferred and poly(ethylmethacrylate) is particularly preferred because it gives such good dip coatings and clean products. Methyl chloroform is also a particularly preferred solvent inasmuch as it has the desired solvent action combined with good evaporation characteristics and low use hazard. Some acrylic copolymers are not sufficiently soluble in methyl chloroform, and for such polymers acetone or methyl ethyl ketone or methylene chloride or xylene or toluene or trichlorethylene can be used as the solvent or added to the methyl chloroform. Any other resin that forms a cohesive film can be used, even wax, so long as it does not contribute contamination as by silicon present in silicone resins.

For the masking it is very desirable to have a kit or package of the combination of masking materials. Thus an assembly of three containers can be packaged as a masking kit, one container having the depletion-reducing masking powder mixture of $Ni_3Al$ with chromium and inhert diluent, a second container having the non-contaminating sheath-forming mixture, and the third container a solution of non-contaminating film-former in the volatile solvent. This solution preferably has a resin content of not over about 8%, and at least about 2%, by weight.

Where the quantity of film former-solution is so large that this solution can be used over a period of time and can lose substantial amounts of its solvent by evaporation before all of the solution is used, the kit can be expanded to include a fourth container that holds fresh solvent with or without a little of the film-former.

Where two different kinds of sheath-forming mixtures are to be used, an extra container holding the second such mixture is added to the kit. The kit can thus have up to five different containers if no fresh solvent supply is included, or as many as six different containers if such supply is included.

The composition of the depletion-reducing masking mixture can vary in the manner described in U.S. Pat. No. 3,801,357. Thus the aluminide can be nickel or cobalt aluminide containing between $\frac{1}{2}$ and $\frac{3}{4}$ atom of aluminum for every atom of nickel or cobalt, the insert particles can range from about $\frac{1}{4}$ to about $\frac{2}{3}$ of this mixture by weight, and the chromium content can range from about $\frac{1}{4}$ to about 3% of this mixture be weight.

The foregoing masking is very effective to prevent the aluminizing of the masked surfaces. It also serves to mask against chromizing. The folowing example demonstrates a very effective chromizing combined with a masked aluminizing.

EXAMPLE 2

A batch of first stage PWA 1455 blades for the hot section of a jet engine are cleaned by degreasing in trichlorethylene and then lightly blasting with 220 grit alumina propelled by an air jet at 30 psig. The blades so cleaned are embedded in the following pack, all percentages being by weight Powdered chromium 1.2%
Powdered nickel 2.4%
Powdered aluminum 0.37%
Powdered alumina 96.03%

All of the powders were minus 325 mesh, their particle sizes ranging from about 20 to about 50 microns, and the mixture well homogenized with repeated siftings, then further mixed with $\frac{1}{2}$% $NH_4Cl$ and $\frac{1}{2}$% $MgCl_2$ and placed in a chromized steel retort before the blades are packed. The packed retort was then covered by an outer retort as described and illustrated in U.S. Pat. No. 3,785,854, care being taken that the outer retort has no leaks and is well sealed. The atmosphere in the outer retort is displaced by a stream of argon introduced through an inlet conduit near the bottom of the interior of the outer retort and exited through an outlet conduit opening near the top of the interior of the outer retort. Heating of the retorts is initiated and the flow of argon maintained through the entire heat a rate that assures essentially no entrance of air or moisture into the interior of the retorts. Where the outer retort has no leaks, an argon flow of about 5 standard cubic feet per hour is adequate.

The pack is held at 1900 to 1950° F. for 30 hours after which heating was terminated and the retorts permitted to cool, the argon stream being maintained. The retorts can be opened when the pack temperature cools to about 300° F., the blades unpacked, cleaned with a blast of air, and washed with water.

The blades have a very good chromized case 0.6 to 1.2 mils in depth, with no alphachrome and no objectionable oxide increase seen on metallographic examination.

The foregoing pack is used without a break-in heat, and has so little metal content that it can be discarded after a single use. If desired, its metal content can be salvaged as by pouring a stream of the used pack through a horizontally moving air stream which deflects away the lighter particles, permitting the metal particles to be collected.

The pack of Example 2 can be modified by incorporating in it about 0.1% magnesium. Chromized cases produced by a pack so modified have even less undersirable oxide visible on metallographic examination, and are of particularly high quality.

In general the pack of Example 2 can have a chromimum content of from about 0.6 to about 2%, a nickel content from about $\frac{1}{2}$ to about 3 times the chromium content, and an aluminum content about 1/10 to about $\frac{1}{3}$ the chromium content. The argon atmosphere of that example can be replaced in whole or in part by helium, neon or other inert gas or mixtures thereof. Other inert diluents like kaolin can be substituted for the alumina in its pack.

The used diffusion coating packs of Example 2 contain a small amount of nickel-alumimum-chromium alloy and can be utilized as masking mixtures in low-temperature aluminizing, that is aluminizing conducted at not over about 1400° F. Thus the used pack can be mixed with 1/5 its weight of a 6% solution of poly (ethylacrylate) and the mixture applied by dipping over the roots of the blades chromized in Example 1, to build up a coating weighting 500 milligrams per square centimeter. The masked blades are then embedded in the following powder pack, the percentages being by weight:
Alumina 85%
Aluminum-silicon alloy ((88%) Al ) 15%
to which is added ½% $NH_4Cl$.

A coating heat in hydrogen with a 30 minute hold at 1350° F. deposits a 10 milligram per square centimeter coating over all unmasked surfaces. The blades are then removed from the pack, the masking mixture brushed off, and then heated in hydrogen having a minus 35° F. dew point for 4 hours at 1975° F. to diffuse the aluminum coatings into the surfaces. They are then rapidly air cooled to below 1000° F., aged for 10 hours at 1600° to 1650° F., and again rapidly air cooled to give blades ready for use with roots only chromized and with their airfoil surfaces chromized and then aluminized.

The most elaborate masking arrangement of the present invention uses a three-layer masking combination in which the workpiece-contacting layer is of the essentially inert type, the next layer of the depletion-preventing type, and the outermost layer of the sheath-forming type. Nickel aluminides present in any masking layer other than a sheath-forming layer, should have no more than about 3 atoms of aluminum for every four atoms of nickel.

To make the masking layers easier to apply, it is helpful to add to the resin solution a little long-chain-hydrocarbon acid such as stearic acid that helps keep the particles of the masking composition dispersed in the volatilizable organic solvent in which they are suspended. As little as about 0.1% of such dispersing aid based on the total weight of the suspension, is enough to impart very good flowability so that the painting, or even dipping of the workpieces, is simpler and produces a more uniform masking layer. However dispersing aid conentrations of at least about 0.3% to about 0.5% are preferred, and as much as 1% can be effectively used.

Hydrocarbon chain lengths as short as 12 carbons and as long as 50 carbons or more are suitable for the dispersing aid. Thus lauric acid, myristic acid, oleic acid, and even copolymers of ethylene and acrylic acid, are effective. The dispersing aid should also be soluble in the solvent in which the masking composition is suspended, and hydrocarbon type solvents including halogenated hydrocarbons give best results.

The effectiveness of the dispersing aid is increased by also dissolving in the suspension a small amount of a surface-active agent, preferably a low-foaming non-ionic surface-active agent such as polyethoxy ether of a linear primary alcohol like cetyl alcohol, or of an alkyl phenol. Only about 0.1% of surface-active agent is all that is needed. It should be noted in this connection that the surface-active agent when added without the long-chain-hydrocarbon acid, has substantially no effect on the masking suspension.

The masking compositions of the present invention can be used to prevent chromizing or to prevent aluminizing. The nickel and/or nickel aluminide in the masking layers combines with either chromium or aluminum or both and in this way prevents significant penetration of either of these metals to the workpiece surface on which the masking is applied.

The essentially inert layer of the masking combination need only weigh about ⅛ gram per square centimeter to improve the masking action by preventing roughening of the workpiece surface being masked. That layer can also weigh as much as about 2 grams per square centimeter, and can be composed of inert materials such as alumina, kaolin or MgO. The presence of about ⅛ to about 5% chromium metal in the essentially inert layer or in the layer above it, contributes a strong depletion-reducing effect.

The following illustrates a more elaborate masking technique.

EXAMPLE 3

A group of hot section turbine engine blades of U-520 alloy (0.05% C, 19% Cr, 12% Co, 6% Mo, 1% W, 3% Ti, 2% Al, 0.005% B, the balance Ni) have their roots masked by dipped coating of three superimposed layers as follows:

first layer—a slurry of 2300 grams of 10 to 20 micron particles of alumina in 1300 grams (1000 cc) of a 7% solution of poly(ethylmethacrylate) in methyl chloroform containing 0.5% stearic acid. Three dips are used to provide a layer containing about 350 milligrams of non-volatiles per square centimeter of surface, and the layer is then permitted to dry by exposure to the atmosphere for about 20 seconds.

second layer—a slurry of 20 to 50 micron particles of $Ni_3Al$, similarly sized particles of Cr and 10 to 20 micron particles of alumina in the foregoing methyl chloroform solution of resin and stearic acid. The slurry contains 50 grams $Ni_3Al$, 5 grams Cr and 45 grams alumina for every 50 cc. of the foregoing solution, and two dips are used to provide about 400 milligrams of non-volatiles per square centimeter of surface. This layer is then permitted to dry.

third layer—a slurry of 20 to 50 micron particles of Ni, similarly sized particles of $Ni_3Al$ and 10 to 20 micron particles of alumina, suspended in the foregoing methyl chloroform solution of resin and stearic acid. The slurry contains 75 grams Ni, 13 grams $Ni_3Al$ and 12 grams $Al_2O_3$ for every 33 cc. of the foregoing solution, and is brushed on to deposit a layer thickess containing about 600 milligrams of non-volatiles per square centimeter of surface. The resulting layer is also permitted to dry.

The slurries are shaken before dipping and before the brushes used for brushing are dipped into them. A little shaking keeps the slurries well dispersed for the few minutes needed to do the dipping or brushing, and each brush stroke applies a uniform slurry stratum that can be built up to the desired total layer thickness by an overlying brush stroke or two. Expert brush manipulation is not necessary.

The blades with the dried three-layer masking on their roots are then diffusion aluminized, and even at aluminizing temperatures as low as 1700° F. such combination forms the hard shell that remains in place and keeps the masking from significantly contaminating the surrounding diffusion-coating pack. The masking is in the form of a hard crack-free shell locked around each blade root. Striking this shell with a wooden mallet or rod breaks the shell into small pieces that do not adhere to the workpiece, and drop off revealing a smooth bright root surface free of diffusion coating. The balace of the blade shows a good diffusion case 4 mils deep.

Such hard shell protection is also formed when the first of the three masking layers, that is the essentially inert layer, is omitted, but the masked workpiece surface is then apt to be not quite as smooth and bright, particularly when the diffusion coating is effected at very high temperatures. With or without the essentially inert layer, at least about 50 milligrams of Ni₃Al or similar nickel aluminide per square centimeter of masked surface assures the most effective masking, and this can be applied with or without the metallic chromium, and with or without the alumina or other inert diluent in the masking layer. When used without the chromium and without the foregoing first layer, some loss of chromium takes place from masked superalloy surfaces. Without its inert diluent the masking layer becomes more expensive unless its thickness is reduced so that more care is needed to assure its proper application.

In general, a slurry used to apply a masking layer should have at least about 20 volume percent and up to about 70 volume percent suspended solids.

Some superalloys are adversely affected by slurry type masking layers when diffusion chromized at high temperatures for long times. Thus the masking combination of Example 3 will tend to cause intergranular attack of the U-520 during a chromizing heat and this tendency can be reduced by conducting the chromizing at temperatures below 1900° F.

For diffusion aluminizing at temperatures below about 1100° F. or diffusion chromizing at temperatures below 1800° F., masking is very effectively provided without the first layer and despite this omission does not cause significant roughening of the masked surface. When masking workpiece surfaces of cobalt or cobalt-base alloys, cobalt aluminides can be used in place of nickel aluminides. However the foregoing three-layer or two-layer masking is also effective when diffusion chromizing plain carbon and low alloy steels.

In general, the masking layer should contain powdered nickel or powdered nickel aluminide or powdered cobalt aluminide, preferably diluted so that it constitutes up to about 90% of the layer, and at least about 25% of the layer, by weight. However, for masking superalloys, where depletion is to be avoided, elemental nickel should not be used in a layer contacting the masked surface of having only an essentially inert layer between it and the masked surface. In such use the masking ingredient should be a nickel or cobalt aluminide having between ⅓ and ¾ atom of aluminum for every atom of nickel or cobalt.

Similarly a sheath-forming layer can have a nickel or $Cr_2O_3$ content of from about 50 to about 100%, and when it contains nickel can also contain aluminum in an amount up to equiatomic with the nickel.

The foregoing percentages do not take into account the resin bonding agent and the like that holds the layers in place but is driven off during the diffusion coating.

The second of the masking layers of Example 3 can be omitted and only the first and third layers used when masking against aluminizing and particularly when aluminizing stainless or low alloy steels.

The sheath-forming layer can be used as a very effective mask without any other helping layers, when aluminizing at temperatures below 1100° F. Sheath formation seems to be caused by the sintering together of the nickel particles in the third masking layer, under the influence of the diffusion atmosphere which causes diffusing metal to diffuse into the nickel of these particles. These particles thus grow in size. The $Cr_2O_3$ particles appear to form some chromium metal that becomes aluminized and sinters to a sheath.

Sheath formation can also be effected by adding to the sheath-forming layer a metal powder like aluminum the particles of which sinter to the nickel particles. Excessive addition is to be avoided to keep the added metal from contaminating the workpiece. Thus an aluminum addition of this type should contribute no more than about one atom of aluminum for every atom of nickel. As little as one one-hundredth of that proportion of aluminum helps the sheath formation, particularly where only a light diffusion is being performed.

The sheath-forming layer can be used to lock masking mixtures about a workpiece surface by partially or completely enveloping that surface. However such sheath formation will also securely hold a masking mixture against a portion of a flat or concave workpiece surface, particularly when such a combination is embedded in a powder pack in a diffusion coating retort.

Other inert diluents such as kaolin or MgO can be substituted for some or all the alumina in each of the foregoing formulations.

As noted, it is convenient to have a kit of masking materials for selective use as needed. Thus one such general utility kit contains separately packaged the inorganic ingredients or ingredient mixtures of the three masking layers of Example 3, along with a separate quantity of the methyl chloroform solution and a separate quantity of methyl chloroform makeup to replenish slurries that have lost excessive solvent through evaporation. The appropriate inorganic ingredients can then be selected and added to the methyl chloroform solution to make any or all of the foregoing layer-forming slurries.

A very desirable kit of this type has
(a) a quantity of diffusion-masking powder,
(b) a quantity of sheath-forming powder, and
(c) a solution of a binder in a volatile organic solvent,
the quantities being so related that the sheath-forming powder is sufficient to form a continuous layer over a continuous layer of the diffusion-masking powder, and the solution forms a workable slurry with both powders.

Such a combination can have for example:
2000 grams of the diffusion-masking mixture of Ni₃Al, chromium and aluminum described for the first coating layer of Example 1;
3000 grams of the sheath-forming mixture of Ni, Ni₃Al and alumina described for the third layer of Example 3; and
one liter of the resin solution of Example 3.

For special situations, one or more of the foregoing ingredient units can be omitted from a kit.

The fragments of sheath broken away from the workpiece after the diffusion coating is completed, can contain large quantities of nickel, and such nickel can be recovered from the fragments, if desired, as by dissolving it out in acid and separating the dissolved nickel from dissolved aluminum by ammoniacal precipitation of the aluminum. Alternatively, the fragments can be crushed into powder, their inert diluent such as alumina separated from the crushed powder by dropping that powder through a horizontally moving airstream that deflects the less dense diluent more than the more dense metal, melting the resulting metal with sufficient freshly added aluminum or nickel to convert the melt to Ni₃Al for reuse as such.

Omitting the stearic acid from the slurries used to apply the masking layers makes it more difficult to keep the slurries uniformly suspended and calls for the slurries to be shaken frequently to reduce settling.

Using the first and/or second masking layers without the third layer causes the applied masking layer or layers to develop cracks and gaps during the diffusion heating as a result of the thermal driving off of the binder resin. This causes such masking to be unreliable.

Omitting the nickel from the outermost of the three layers keeps it from forming the desired protective shell, unless the omitted nickel is replaced by $Cr_2O_3$. The remaining ingredients of the outermost layer make it more generally effective and easier to apply, but are not essential.

Water can be used in place of or in addition to the volatilizable organic solvent in the foregoing slurries but is not preferred, even when used with a water-soluble or water-dispersible binder.

The substitution of other acrylic resins such as poly (ethyl acrylate) or similar binder resins for the poly (ethyl methacrylate) of Example 3 does not materially change the results. Other solvents such as toluene can also be substituted for the methyl chloroform, but the methyl chloroform has a combination on non-flammability, volatility and lack of health hazard, that makes it particularly desirable.

The outermost or sheath-forming layer of the masking combination makes a very effective retaining or securing means that assures the locking of other types of layers beneath it onto the workpiece surface through the coating heat. The same securing action can be used to hold a slurry coating layer instead of a masking layer, on the workpiece. This is illustrated in the following examples and makes it unnecessary to have the workpiece embedded in a coating pack.

EXAMPLE 4

A 5-foot length of steam generator high pressure tubing of Croloy alloy (1.9 to 2.6% Cr, 0.97 to 1.13% Mo, 0.15% C, balance essentially iron) having a ¾ inch bore and a ½ inch wall was thoroughly cleaned inside and out, and had its bore filled with a chromizing pack composed of a previously broken-in mixture of 10% chromium powder the particle sizes of which range from about 10 to about 20 microns, and
90% tabular alumina granules having a particle size ranging from about 100 to about 300 microns to which mixture was added ½% NH$_4$Cl granules as an activator. The breaking-in was effected by a mixture of the foregoing three ingredients in a retort in the absense of a workpiece, to 1800°-1850° F. for 10 hours under hydrogen. The tube so filled had its ends capped with 1010 steel caps frictionally fitted over the tube ends so as to provide semi-gas-tight covers.

The outside surface of the tube was then painted with the following layers in succession, drying the first layer for a few minutes before applying the second:

first layer—600 grams of a previously broken-in mixture of 45% Cr, 45% alumina and 10% Al, to which ½% NH$_4$Cl is added before as well as after break-in as described in U.S. Pat. No. 3,801,357, suspended in 200 cc of methyl chloroform solution containing 7 weight percent of a copolymer of 70% ethyl and 30% methyl methacrylates, 0.5 weight percent stearic acid and 0.1 weight percent cetyl ether of decaethoxy ethanol. Four applications of this mixture are made with intervening drying to build the nonvolatile coating to 1200 milligrams per square centimeter of tube surface.

second layer—600 grams of a mixture of 68.5% Ni powder and 31.5% Al powder, dispersed in 150 cc of above methyl chloroform solution. The metals of this slurry were not pre-fired, and only two applications of this slurry was made to provide a non-volatile coating weight of about half that of the first layer.

The tube so prepared was placed in a tubular retort of a diffusion coating furnace assembly having inlet and outlet connections for a hydrogen-blanketing as in U.S. Pat. No. 3,801,357 and then subjected to a diffusion coating heat of 1800° F. for 10 hours. After cooldown at the end of the heat, the tube end caps were removed, the pack in the tube bore poured out, and the sheath around the exterior of the tube broken off and removed. The interior of the tube was effectively chromized with a case 1.8 to 2.3 mils thick, and the outside of the tube aluminized with a case about 24 mils thick.

The chromized case includes an outer portion about 0.3 mil thick rich in chromium carbide, and an inner portion of columnar chromized structure. This case is particularly effective in reducing erosion of the internal tube surface by rapidly moving high pressure steam.

The aluminized outer surface prolongs the life of the tube in a coal- or oil-fired furnace where it is subjected to combustion atmospheres at temperatures as high as about 1000° F.

The internal pack is a highly fluent composition that is easily poured into place before the heat, and is readily removed afterwards, using a minimum of mechanical poking and the like. Such a pack is particularly desirable for packing of cramped recesses in the interior or workpieces, such as in the narrow bores described above, or in hollow jet engine blades, or the like.

The noted fluency is brought about because the alumina granules, which are crushed from alumina which has been melted and solidified, are quite fluent and show a flow angle of about 45 degrees. This is the angle of incline (measured from the horizontal) of a cone made by pouring a stream of the granules onto one spot to build up a cone. The fluency can be increased by selecting aluminas or other inert particles having an even smaller flow angle. Thus alumina microspheres having particles sized about 100 to about 500 microns are exceptionally fluent. Tabular alumina, which can be made by sintering alumina powder and then crushing, is also fluent, and is preferred because it tamps in place better and then during the diffusion coating does not shrink from the surface against which it is tamped.

The pack need only have about ½ its volume of any of the foregoing fluent materials. Thus the chromium particles by themselves need not be fluent at all, and will provide a suitable fluent pack when ½ of the pack is constituted by the fluent granules or microspheres. Similarly non-fluent alumina or other non-fluent inert material can be present in the pack with or without non-fluent chromium powder, without detracting significantly from the fluency provided by the foregoing volume of fluent material.

Fluent packs are very helpful when the workpiece being coated has a portion of its surface masked to prevent coating there. For such masking the shell-forming masking materials described in application Ser. No. 752,855 are highly desirable, and the fluent coating pack makes it easier to recover the masked workpiece at the completion of the coating operation with their masking intact. Little or no mechanical working of the fluent pack is needed to remove it from the retort and thus expose the masked workpieces. Thus a used fluent pack is readily removed from the interior of a narrow pipe, for instance, by pushing a narrower tube into the pipe bore and blowing air through the tube as it moves into that bore.

Fluent coating packs also do not require much tamping into place and this reduces the chances of disturbing the masking when the masked workpieces are loaded into a retort at the beginning of a coating operation.

The key feature of the improved masking is the application on the surface portion to be masked, of one or more layers of a masking mixture that inhibits depeletion of important alloy ingredients from the substrate as a result of outward diffusion during the diffusion coating heat, and also forms a protective shell to secure the masking in place. The layer or layers are conveniently applied from a dispersion in a volatile solvent in which is dissoled a resin such as an acrylate that is driven off during the diffusion coating heat. The dispersion is very simply applied by brushing or dipping and the volatile solvent, such as methyl chloroform, permitted to evaporate off for a few seconds to set the solids.

A very effective depletion-preventing slurry is essentially a mixture in the following proportions, of
$Ni_3Al$ powder 40 to 60 grams
Cr powder 4 to 6 grams
alumina powder 40 to 60 grams
in 50 cc of a 5 to 10% by weight solution of poly(ethyl-methacrylate in methyl chloroform. The powders preferably have particle sizes no greater than about 50 microns, and any other inert powder, such as kaolin, can be used in place of the alumina. About 200 milligrams of non-volatiles per square centimeter are applied from a single dip or a single brushing in such a dispersion, and the dips or brushings repeated to build up the non-volatile weight to about 400 milligrams per square centimeter. For low temperature diffusion coating as with aluminum, the chromium content of the solids in the above slurry can be reduced and can be as low as 1% of all the solids.

The grey appearance of the foregoing mixtures as applied to the substrates, are sometimes difficult to visually distinquish on the substrate. Should it be desirable to make them stand out with more contrast, the mixture can be given some different color, as by substituting dark green $Cr_2O_3$ powder for some or all of the alumina. Substituting $Cr_2O_3$ for as little as one-twelfth of the alumina makes a distinct improvement in the distinguishability of the applied powder-resin layer.

Some aluminas are colored reddish and they can also be used for increasing the contrast in the appearance of the powder resin layer. If desired a little dye can be added to the dispersion for the same purpose. Where two or more different types of layers are built up to make a masking combination, each different type of layer can be given a different color to make them more readily distinguishable.

The fluent dispersion coating packs are also highly beneficial for use in chromizing bent small-bore tubing. Thus for some steam-generating arrangements lengths of steam-generating tubes have one end bent back 180 degrees to form cane-shaped units which can have their ends welded to additional lengths to form a continuous furnace tube assembly. The packing of the bores of such "canes" for diffusion coating, and the subsequent pack removal after coating, is greatly simplified by the use of fluent packs.

As pointed out, the shell-forming layer used to hold a slurry coating in place where there is not much of an aluminizing or chromizing atmosphere, contains non-contaminating materials that sinter together under coating conditions. Thus nickel and aluminum powders smaller than about 500 microns in size and in an atom proportion from about 1:0.9 to about 1:1.1 are very effective. Chromium can be substituted for the nickel in such a mixture. Because of the non-contaminating character, a diffusion coating pack will not be ruined in the event a small amount of the masking materials should inadvertently become mixed into it.

Masking of diffusion coatings can also be accomplished in other ways. Thus on ordinary irons and steels as well as low alloy steels, a localized layer of powdered iron appropriately diluted with inert diluent such as alumina, can be applied to reduce or prevent diffusion coating under the layer. This layer can be covered by a sheath-forming layer, but such covering is not needed where the workpieces are not roughly handled during treatment.

Such simple masking can be effected for example on chain saw cutter blades or other cutting edges that are subjected to substantial wear and it is desired to maintain cutting effectiveness notwithstanding the wear. On this basis the cutting edge can be in the form of a narrow edge face on a steel flange, one surface of the flange being very hard and the opposite surface of the flange being relatively soft. The edge face connects those two surfaces and is preferably tapered so that the edge of the harder surface projects out further than the edge of the softer surface, thus providing good cutting action. During use the edge face wears with the softer portion wearing faster than the harder poriton so that the cutting effectiveness of the edge face is maintained quite well.

According to the present invention the cutter blades can be made of carbon steel and can be diffusion chromized on one surface to harden it. The opposite surface is masked as by the iron powder layer referred to above, slurrying it in a solution of a resin binder. Such a slurry can be readily applied, with a medicine dropper for example, to the desired surface of a small blade, and after such a coating layer sets the coated blade can be chromized to harden its uncoated surface.

For chromizing at low temperatures, such as 1300° to 1400° F., the masking layer need not contain any inert diluent, but at higher temperatures inert diluent such as alumina or kaolin will keep the iron powder from sintering to the cutters. A mixture of iron powder and alumina in which the alumina content is as high as 90% is suitable for masking a modest chromizing. This is illustrated in the following example.

EXAMPLE 5

A quantity of chain saw cutters made of high carbon steel having the formulation
0.65% carbon
0.3% manganese
0.75% nickel
0.5% chromium
0.15% molybdenum
balance essentially iron
are prepared by cleaning and then have their under surfaces individually coated with a slurry of a mixture of 80% alumina and 20% iron powder, suspended in a methyl chloroform solution of 2% poly (ethyl methacrylate) and 0.1% stearic acid. The coating weight of the dried coating is about 100 milligrams per square centimeter.

The resulting cutters are embedded in a chromizing mixture corresponding to that used for the internal chromizing in Example 4 but using non-fluent calcined 360 mesh alumina powder in place of the tabular alumina. The diffusion coating pack so made, held in a retort, is subjected to a diffusion coating heat as in Example 4, the pack being held at 1600° F. for five hours.

After cooldown, the retort is opened and the cutters removed and cleaned. A blast of fine glass particles propelled by a stream of air from a 10 psig source removes the masking layer, and the resulting cutters have a 0.4 mil thick chromized case on the unmasked surfaces. The masked surfaces show much less chromizing as well as a greater degree of wear in use.

A fluent pack is not needed for such chromizing, but can be used if desired. Should portions of the masking layers break off during handling and remain in the coating pack, no significant harm is done inasmuch as such an iron-contaminated pack can still be very effectively reused to chromize ferrous surfaces.

To keep from decarburizing carbon away from the carbon steel being chromized, the chromized temperature can be kept from exceeding about 1850° F., and is preferably not over about 1750° F. Cutter blades made of type 416 stainless steel can also be treated in the foregoing manner with corresponding results.

The diffusion coating of nickel or DS nickel with chromium or aluminum can be correspondingly masked by a masking layer of nickel powder, preferably containing about 20 to about 90% inert diluent to keep it from sintering to the surface being masked. Other substrates can likewise be masked by a powdered masking layer having the same or essentially the same composition as the substrate. Some substrate ingredients such as carbon, silicon, manganese and aluminum generally do not have to be present in such masking layer to minimize loss of those ingredients from the substrate during a diffusion heat.

Instead of completely masking off a diffusion coating in selected locations, the diffusion can be arranged to form a thinner case in selected locations, as for example where dimensional tolerance is very tight. This is demonstrated in the following example.

EXAMPLE 6

Hollow first stage PWA 1422 blades for the hot section of a jet engine had their interiors and exteriors cleaned by the degreasing and blasting described in Example 2, and their interiors were then filled with the following powder pack mixture, all percentages being by weight:

$Al_2O_3$ 40%
Chromium 45%
Aluminum 15% to which ½% $NH_4Cl$ was added. All of the powders had particle sizes between about 20 and about 50 microns, and the mixture had been pre-fired with a previous addition of ½% $NH_4Cl$. The filling of the interiors was assisted by vibration of the blades.

Each blade then had its airfoil end embedded in a batch of the following powder pack mixture held in a short aluminized steel tube closely fitting the airfoil, as described in U.S. Pat. No. 3,824,122:
$Al_2O_3$ 75%
Chromium 15%
Aluminum 8.8%
Silicon 1.2% to which ½% $NH_4Cl$ is added. This mixture had also been prefired to break it in with a previous addition of ½% $NH_4Cl$.

The collection of blade-holding tubes was then placed in a shallow aluminized retort, with the root of each blade pointing up, and that retort was then filled with the same powder pack used to fill the blade interiors, until all root were covered by that pack. The retort so packed was then covered with an outer retort and subjected to a coating heat treatment in a hydrogen atmosphere with the temperature held at 1620° to 1700° F. for 6 to 7 hours. After cooldown the retort is unpacked, the blades removed and cleaned both internally and externally, and then given post heat treatment at 1980°–1990° F. for two hours. The final products showed 1 to 2.5 mil thick aluminized cases in their interiors and on their roots, with a 3 to 4.5 mil aluminized case on their airfoil surfaces. All coatings were of high quality.

The formulation for the two packs of this example can be varied as by a plus or minus departure from the above metal (including silicon) content figures, by an amount about ⅛ each figure. It is preferred however that the chromium-to-aluminum weight in the first pack be between 2.9 and 3.1.

Instead of positioning the airfoils in the closelyfitting individual tubes, the blade roots can be positioned, and the individual tubes then packed with a masking powder, such as the following mixture:
42.3 weight % of $Al_2O_3$
36.9 weight % of Ni
5.6 weight % of Al
15.1 weight % of Cr
U-520 blades so packed have their airfoil very effectively chromized in the following chromizing pack
45% chromium powder
23.5% nickel powder
3.6% aluminum powder
27.9% alumina powder
This mixture is activated with ½% $NH_4Cl$ and broken in by heating to 1950°–1975° F. for 12 hours without a workpiece. The broken in mixture is then finely divided, ½% $NH_4Cl$ added again, and packed in with the blades and subjected to the diffusion-coating heat at 1950°–1975° F. for 10 hours. The masked roots do not pick up any significant coating. Also the masking powders contain sufficient nickel in excess of the aluminum, to grow together and form a weakly coherent mass that does not contaminate the diffusion-coating pack. The chromium content of this masking mixture can be diminished, if desired, to as little as 5%, and such mixtures are very good for masking any superalloy.

The chromized blades with the masked roots are desirably given an aluminized top coating, before or after the masking is removed from the roots. Such aluminizing is preferably of the chromium-inhibited type described in U.S. Pat. No. 3,801,367.

Aluminide coatings can be removed from superalloys where fresh coatings are needed, and even to vary the coating thickness, by the processes described in U.S. Pat. Nos. 3,458,353 and 3,622,391. These processes use dips in stripping solutions of aqueous nitric acid containing dissolved fluoride. A preferred stripping solution contains about 3 to about 20 weight percent nitric acid, and about ½ to about 5 weight percent of dissolved fluoride computed as hydrogen fluoride.

While such stripping solutions are highly effective at moderate temperatures, e.g. 50° to 115° F., their action on some coatings is sometimes slow. The stripping can be accelerated by a follow-up dip in essentially fluoride-free aqueous nitric acid having about 10 to about 30 weight percent acid, for at least about 5 minutes. Even speedier removal is effected by repeating the fluoride-containing and fluoride-free nitric acid dips, with an intervening water rinse.

A particularly desirable sequence is shown in the following example.

EXAMPLE 7

A number of INCO 713 aluminized first stage blades are subjected to the treatment steps:
(a) Clean with a blast of dry 220 grit aluminum oxide propelled by a jet of air from a 30 psig source.
(b) Immerse for 30 minutes at 80°–90° F. in a fluoride-containing nitric acid solution prepared by dissolving 2 ounces of ammonium bifluoride and 10 fluid ounces of 70% nitric acid, in sufficient water to make one gallon.
(c) Rinse with running water.
(d) Rinse ultrasonically in water for two minutes.
(e) Dip for 30 minutes at 90°–100° F. in aqueous nitric acid containing 17 weight percent technical grade $HNO_3$.
(f) Rinse in running water.
(g) Rinse ultrasonically in water for two minutes.
(h) Repeat the sequence of steps (b) through (g) two more times.
(i) Grit blast as in step (a).

The temperatures of the fluoride-free acid bath can be as low as about 60° F. and as high as about 125° F., and still provide very good action. Higher temperatures tend to generate vapors that make the bath a serious health hazard, and are best avoided. For the same reason the fluoride-containing bath is best operated at from 50° to about 115° F.

The chemical attack of the acid dips stops of its own accord after the aluminide coating is entirely removed, so that there is no great danger in prolonging the dip treatments. However dips longer than about 30 minutes are not particularly helpful and unduly prolong the treatment.

The rinsing between fluoride-free acid dip and a fluoride-containing acid dip that follows, can be omitted. The rinsing between the fluoride-containing acid dip and the fluoride-free acid dip that follows, is helpful in that it keeps the fluoride-free acid from accumulating too much fluoride that can be carried over from the fluoride-containing acid dip. The fluoride-free acid dip should have less than about 0.1% and preferably less than 0.05% fluoride content.

The rinsing liquid need not be water, but can be some other liquid such as chloroform, methylethylketone, or mixtures of such liquids.

Obviously many modifications and variations of the present invention are possible in the light of the above teachings. It is therefore to be understood that within the scope of the appended claims the invention may be practiced otherwise than as specifically described.

What is claimed:

1. In the method of applying a diffusion coating to a limited portion of the surface of a substrate, the improvement according to which the limited surface portion is delineated by applying a delineating coating and then holding the delineating coating in place by applying over it a sheath-forming layer.

2. The combination of claim 1 in which the delineating coating is a coating that causes diffusion metallizing on the surface it coats.

3. The combination of claim 1 in which the delineating coating is a masking coating that inhibits diffusion metallizing on the surface it coats.

4. The combination of claim 1 in which the sheath-forming layer is essentially powdered nickel and a resin binder that is driven off at diffusion coating temperatures.

5. The combination of claim 4 in which the sheath-forming layer is deposited from dispersion in a chloroform solvent in which the binder is dissolved and which also contains a dispersing aid that helps disperse the powdered nickel in the solution.

6. The combination of claim 1 in which the coating held in place by the sheath-forming layer, contains inert refractory diluent.

7. A metal workpiece having a portion of its surface covered with an adherent layer of a resin-binder-containing first powder mixture, that layer being in turn covered with an adherent layer of a second powder mixture, the first mixture being one that has a selective diffusion coating effect on the surface it covers, and the second mixture being one that is converted by a diffusion coating treatment to a coherent sheath encasing the first mixture.

8. The combination of claim 1 in which the pre-coating includes a resin binder that adherently holds the pre-coating on the substrate until the diffusion coating heat is applied.

9. The combination of claim 1 in which the delineating coating or the sheath-forming coating, or both, includes a resin binder that adherently holds them on the substrate until the diffusion coating heat is applied.

10. A metal workpiece having a portion of its surface covered with an adherent layer of a resin-binder-containing inert diluent powder, that layer is in turn covered with a resin-binder-containing powder layer also containing diffusion-masking metal, and the latter layer is in its turn covered by an adherent powder mixture that is converted by a diffusion-coating treatment to a coherent sheath encasing the lower layers.

* * * * *

UNITED STATES PATENT AND TRADEMARK OFFICE
CERTIFICATE OF CORRECTION

PATENT NO. : 4,464,430

DATED : Aug. 7, 1984

INVENTOR(S) : ALFONSO L. BALDI

It is certified that error appears in the above-identified patent and that said Letters Patent are hereby corrected as shown below:

In line 8 of the Abstract text, change "of" to --or--;

Column 1, line numbered 12, change "continuation-in-part" to --continuations-in-part--;

Column 3, line numbered 31, change "lattter" to --latter--;

line numbered 39, change "additinal" to --additional--;

line numbered 67, change "tbe" to --the--;

Column 4, line numbered 6, "duringthe" should be --during the--;

line numbered 20, "curst" should be --crust--;

line numbered 30, "individuallyand" should be --individually and--;

UNITED STATES PATENT AND TRADEMARK OFFICE
CERTIFICATE OF CORRECTION

PATENT NO. : 4,464,430                     Page 2 of 3
DATED     : Aug. 7, 1984
INVENTOR(S) : ALFONSO L. BALDI It is certified that error appears in the above-identified patent and that said Letters Patent are hereby corrected as shown below:

line numbered 59, "maksing" should be --masking--;

Column 5, line numbered 19, "alyers" should be --layers--;

Column 7, line numbered 5, "weighting" should be --weighing--;

Column 12, line numbered 20, "includes" should be --included--;

Column 13, line numbered 59, change "dispersion" to --diffusion--;

Column 16, line numbered 8, change "root" to --roots--;

line numbered 26, change "closelyfitting" to --closely-fitting--;

UNITED STATES PATENT AND TRADEMARK OFFICE
CERTIFICATE OF CORRECTION

PATENT NO. : 4,464,430

DATED : Aug. 7, 1984

INVENTOR(S) : ALFONSO L. BALDI

It is certified that error appears in the above-identified patent and that said Letters Patent are hereby corrected as shown below:

Column 16, line numbered 57, change "3,801,367" to --3,801,357--;

Column 18, change claim 8 to:

--The combination of claim 1 in which one of the coatings contains a distinctively colored ingredient that renders the coatings readily distinguishable visually.--

Signed and Sealed this

Nineteenth Day of March 1985

[SEAL]

*Attest:*

DONALD J. QUIGG

*Attesting Officer*     *Acting Commissioner of Patents and Trademarks*